US006323731B1

(12) United States Patent
McCune, Jr.

(10) Patent No.: US 6,323,731 B1
(45) Date of Patent: Nov. 27, 2001

(54) VARIABLE BIAS CONTROL FOR SWITCH MODE RF AMPLIFIER

(75) Inventor: Earl W. McCune, Jr., Santa Clara, CA (US)

(73) Assignee: Tropion, Inc. Corp., Cupertino, CA (US)

(*) Notice: Subject to any disclaimer, the term of this patent is extended or adjusted under 35 U.S.C. 154(b) by 0 days.

(21) Appl. No.: 09/684,496

(22) Filed: Oct. 6, 2000

(51) Int. Cl.[7] ................................................... H03F 3/217
(52) U.S. Cl. ........................... 330/251; 330/296; 330/297
(58) Field of Search .............................. 330/207 A, 251, 330/296, 297

(56) References Cited

U.S. PATENT DOCUMENTS

| 5,392,004 | * | 2/1995 | Masliah | 330/296 |
| 5,789,983 | * | 8/1998 | Fujita | 330/277 |
| 5,986,503 | * | 11/1999 | Ichikawa | 330/277 |
| 5,994,963 | * | 11/1999 | Kawai et al. | 330/277 |

* cited by examiner

*Primary Examiner*—Robert Pascal
*Assistant Examiner*—Henry Choe

(57) ABSTRACT

The present invention, generally speaking, provides for the effective use of dynamic bias control in a switch-mode RF amplifier to achieve an output signal having wide dynamic range. In one aspect, a method is provided of amplifying an RF signal to produce a variable output signal using an amplifier including a final amplification stage having a control terminal. The method includes: applying to the control terminal of the final amplification stage a drive signal and a bias signal; and varying the bias signal as a function of a desired output power of the variable output signal. The drive signal and the bias signal together cause the final amplification stage to be driven repeatedly between two states, a hard-on state and a hard-off state, without operating in a linear operating region for an appreciable percentage of time, and the final amplification stage is controlled without continuous or frequent measurement and feedback adjustment of the variable output signal.

6 Claims, 4 Drawing Sheets

VARIABLE BIAS CONTROL FOR SWITCH MODE RF AMPLIFIER

FIELD OF THE INVENTION

The present invention relates to RF amplifiers, particularly switch mode RF amplifiers.

DESCRIPTION OF RELATED ART

Conventional RF amplifier architectures follow a linear approach in which amplifying elements—i.e., transistors—are operated in their linear region. Although such operation is relatively inefficient, it is well-understood. To improve efficiency, various switch-mode amplifier architectures have been proposed, beginning most notably with the Class E amplifier architecture described in U.S. Pat. No. 3,900,823 to Sokal et al. (1975), incorporated herein by reference. In Class E operation, amplifying elements are operated as switches, resulting in a non-linear system. The foregoing patent describes the use of negative feedback techniques to control the output signal of a non-linear, switch-mode amplifier.

Other patents describe architectures in which multiple non-linear amplifier stages are paired or ganged and the output signals thereof combined to form a resulting linear output signal. Examples of such patents include U.S. Pat. No. 5,990,738 and references cited therein. To the extent that switch-mode RF amplifiers have been put into practice, the use of feedback control or superposition has typically been followed.

One exception is French Patent 2,768,574, incorporated herein by reference. This patent describes a switch-mode RF amplifier architecture that does not rely on feedback to control the output amplifier output signal. Nevertheless, the proposed architecture is subject to various practical limitations not addressed in the patent. In particular, experience has shown that the proposed architecture is subject to distinct amplitude modulation frequency limitations and that the output signal exhibits limited dynamic range. High frequency operation and wide dynamic range are key to emerging high-speed wireless data communication initiatives.

Dynamic bias control has been proposed in conventional RF amplifier architectures for the purpose of improving efficiency. See for example U.S. Pat. No. 6,025,754. Bias control is also discussed in the aforementioned U.S. Pat. No. 3,900,823. However, none of the foregoing prior art describes the effective use of dynamic bias control in a switch-mode RF amplifier to achieve an output signal having wide dynamic range.

SUMMARY OF THE INVENTION

The present invention, generally speaking, provides for the effective use of dynamic bias control in a switch-mode RF amplifier to achieve an output signal having wide dynamic range. In one aspect, a method is provided of amplifying an RF signal to produce a variable output signal using an amplifier including a final amplification stage having a control terminal. The method includes: applying to the control terminal of the final amplification stage a drive signal and a bias signal; and varying the bias signal as a function of a desired output power of the variable output signal. The drive signal and the bias signal together cause the final amplification stage to be driven repeatedly between two states, a hard-on state and a hard-off state, without operating in a linear operating region for an appreciable percentage of time, and the final amplification stage is controlled without continuous or frequent measurement and feedback adjustment of the variable output signal.

In another aspect, an amplifier is provided having a variable output signal and including a final amplification stage having a control terminal; a driver stage preceding the final amplification stage, the driver stage producing a drive signal applied to the control terminal of the final amplification stage; and control circuitry producing a variable bias signal, also applied to the control terminal of the final amplification stage. The control circuitry varies the bias signal as a function of a desired output power of the variable output signal. Once again, the drive signal and the bias signal together cause the final amplification stage to be driven repeatedly between two states, a hard-on state and a hard-off state, without operating in a linear operating region for an appreciable percentage of time, and the final amplification stage being controlled without continuous or frequent measurement and feedback adjustment of the variable output signal.

BRIEF DESCRIPTION OF THE DRAWING FIGURES

The present invention may be further understood from the following description in conjunction with the appended drawing figures. In the figures.

DETAILED DESCRIPTION OF THE PREFERRED EMBODIMENTS

Figure 1:
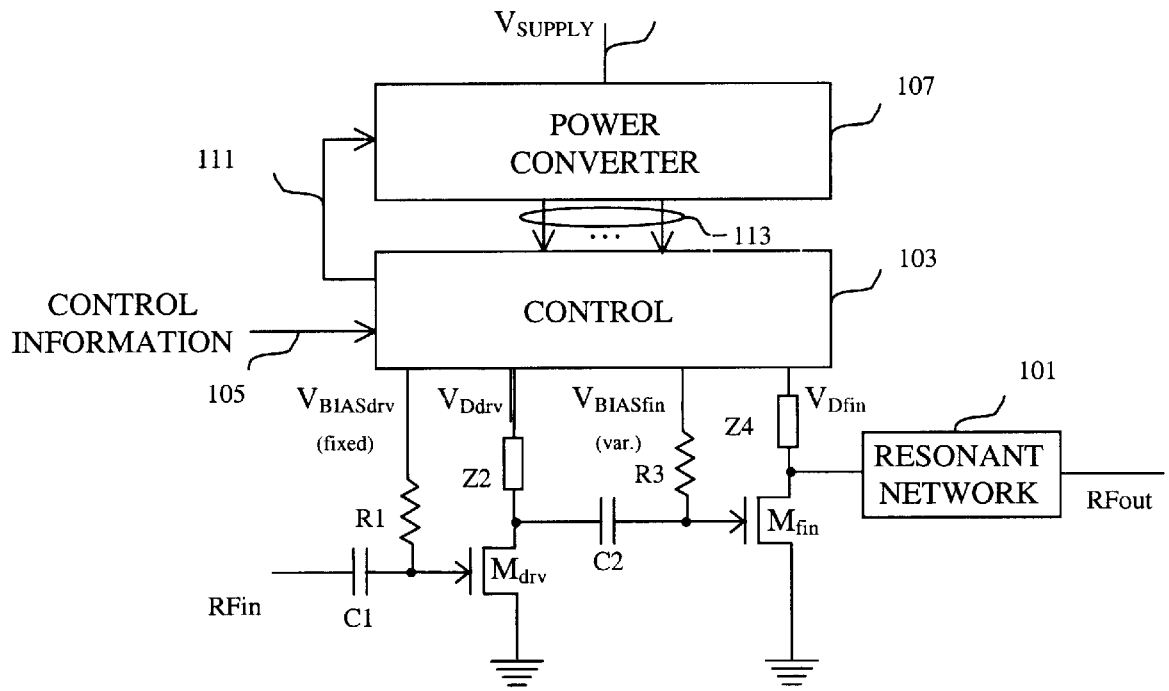
FIG. 1 is a block diagram of an amplifier in an exemplary embodiment.
Figure 2:
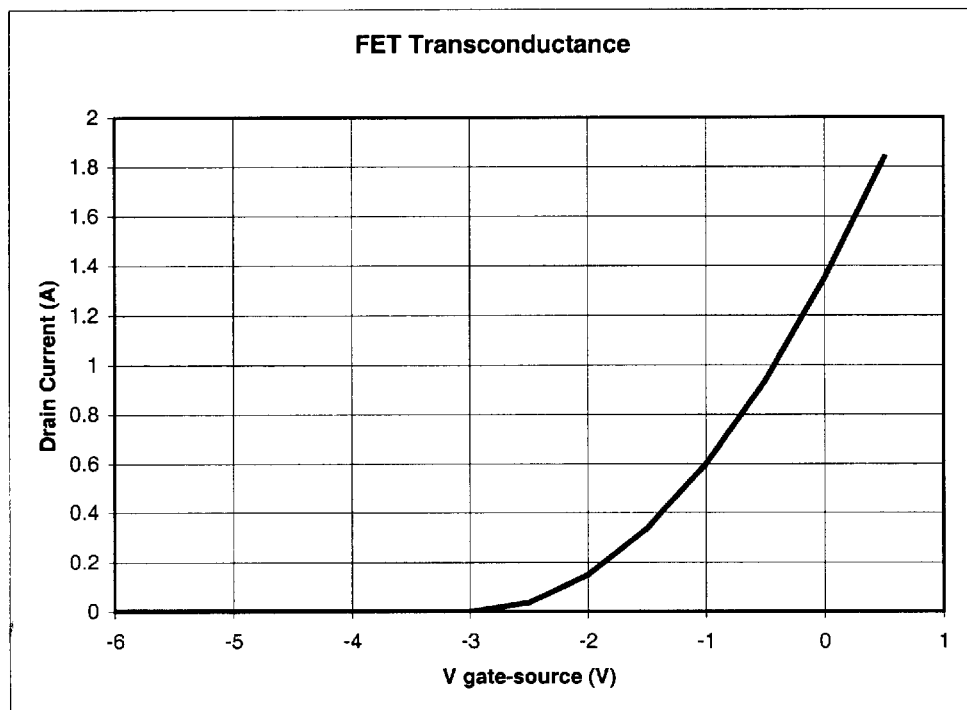
FIG. 2 is a plot of transconductance typical of the amplifications elements of FIG. 1.

Referring now to FIG. 1, a block diagram is shown of an RF amplifier in accordance with an exemplary embodiment of the invention. Unnecessary details of the amplifier circuitry have been omitted for clarity. An RF input signal RFin is applied through a capacitor C1 to a control terminal of a driver amplification stage having an amplification element, shown in this example as a FET (e.g., MESFET) $M_{drv}$. The amplification stage $M_{drv}$ may have a transconductance as shown for example in FIG. 2. The RF input signal is preferably a constant-peak-amplitude signal and is typically phase modulated. The driver amplification stage produces an amplified output signal that is applied through a capacitor C2 to a control terminal of a final amplification stage. The final amplification stage has an amplification element, shown in this example as an FET $M_{fin}$. The final amplification stage produces a further amplified output signal that is applied to a resonant network 101. An output signal of the resonant network forms the output signal of the RF amplifier, RFout.

The amplification elements $M_{drv}$ and $M_{fin}$ each have a bias voltage applied to a control terminal thereof and an operational voltage applied to another terminal (e.g., the drain terminal) thereof. In particular, a bias voltage $V_{BIASdrv}$ is produced by a control circuit 103 and applied through a resistor R1 to the control terminal of the amplification element $M_{drv}$, and an operational voltage $V_{Ddrv}$, also produced by the control circuit 103, is applied through a load impedance Z2 to the drain of the amplification element $M_{drv}$. Similarly, a bias voltage $V_{BIASfin}$ is produced by the control circuit 103 and applied through a resistor R3 to the control terminal of the amplification element $M_{fin}$, and an operational voltage $V_{Dfin}$, also produced by the control circuit 103, is applied through a load impedance Z4 to the drain of the amplification element $M_{fin}$. In the illustrated embodiment, the bias voltage $V_{BIASdrv}$ is fixed. The bias voltage $V_{BIASfin}$, on the other hand, is variable.

The control circuit 103 produces the bias and operational voltages in response to control information (e.g., amplitude or output power information) received on an input line 105 and in cooperation with a power converter 107, which receives a supply voltage $V_{SUPPLY}$ on an input line 109. The control circuit 103 controls the power converter 107 via one or more control lines 111. In response, the power converter produces one or more voltages 113, which are applied to the control circuit. These one or more voltages may be used directly by the control circuit or further modified by the control circuit to produce the bias and operational voltages.

Further details regarding the amplifier of FIG. 1, including the control circuit 103 and the power converter 107, may be found in U.S. patent applications Ser. No. 09/637,269 and 09/684,496, incorporated herein by reference.

Figure 3:
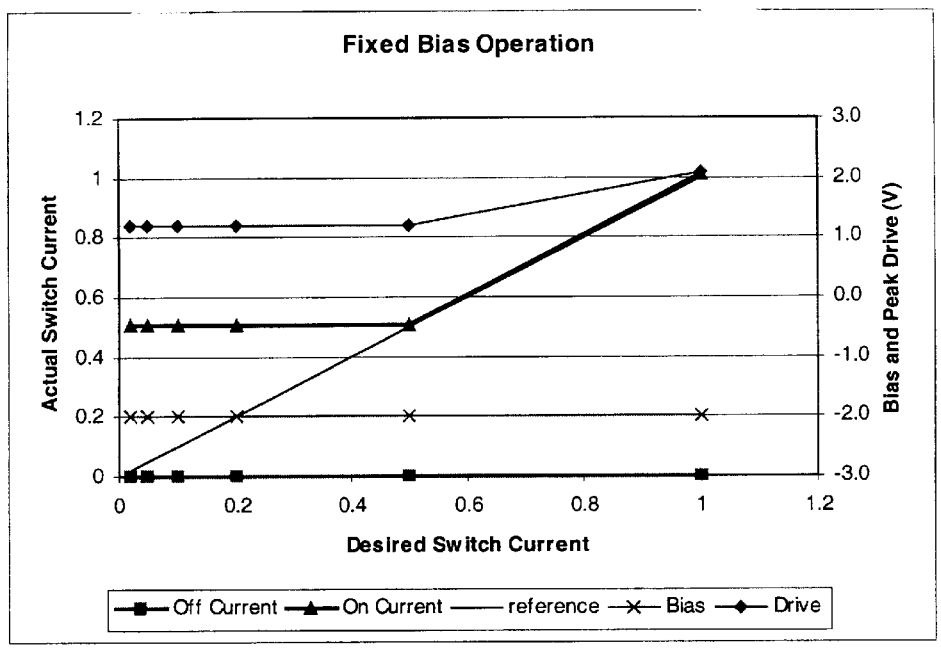
FIG. 3 is a plot of relevant signals within the final amplifier stage under a fixed bias condition.

Under fixed bias conditions, a MESFET will typically exhibit an output magnitude control range of between about 18 and 35 dB. Referring more particularly to FIG. 3, a desired switch current and an actual switch current are shown for a fixed bias as a function of a peak drive voltage. Both the switch current during the ON condition and the switch current during the OFF condition are shown. Ideally, of course, the actual switch current during the ON condition would equal the desired switch current as indicated by the reference line (y =x), and the actual switch current during the OFF condition would be zero. In the present example, the bias voltage is fixed at −2V, which is near optimal for peak output power. The peak drive voltage ranges from near zero to about 2V.

Note that at roughly half-scale output, in order to maintain switching action, it becomes impossible to further decrease the drive signal. The drive signal peak magnitude is therefore held constant below some fixed level. That is, at some point the input drive signal amplitude cannot be reduced further without causing the output transistor $M_{fin}$ to longer switch. This sets a minimum amount of leakage from the drive to the output.

Figure 4:
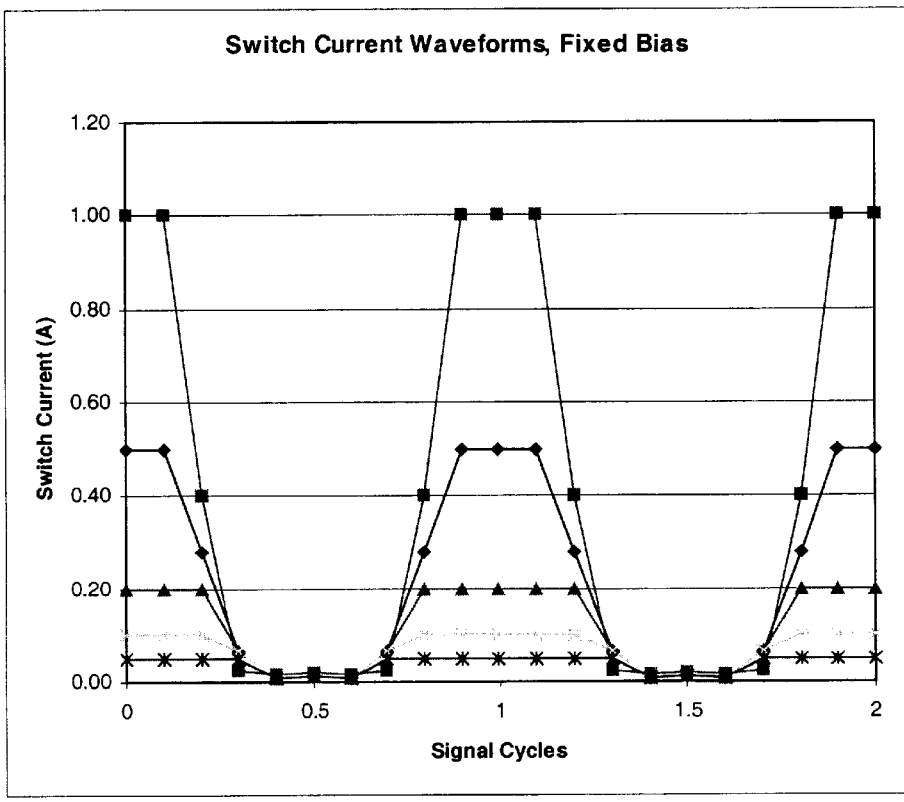
FIG. 4 is a plot of current within the final amplifier stage at various drive levels under a fixed bias condition.

The effect of the foregoing leakage may be seen in FIG. 4, showing the switch current waveform over multiple cycles at the different drive levels identified in FIG. 3. With the drive signal peak magnitude held constant below some fixed level, the ability to turn the output transistor on is preserved. However, the ability to turn the output transistor fully off is lost. That is, because of parasitics and leakage, the output transistor cannot be driven in such a way as to cause the RF output signal to go to zero or essentially zero. As a result, the dynamic range of the fixed-bias amplifier stage becomes restricted.

Figure 5:
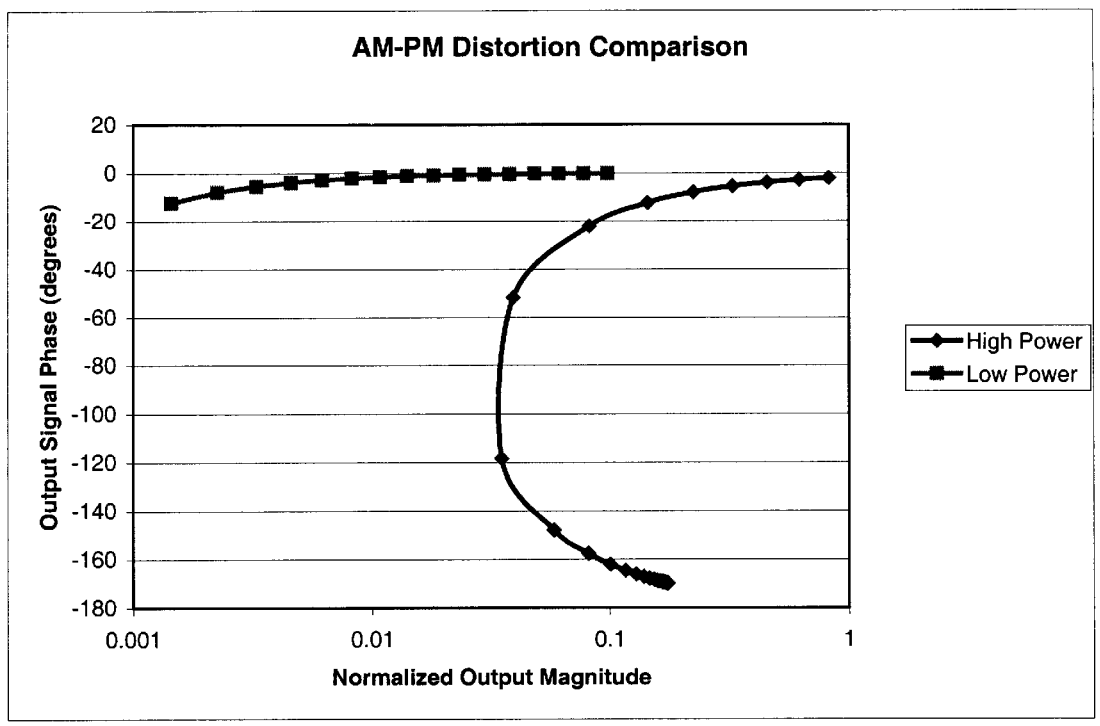
FIG. 5 is a comparative plot illustrating AM-PM distortion characteristics of the prior art and of a circuit using the present invention.

Although on a logarithmic scale the distortion of FIG. 4 appears relatively benign, in operations, its effect can be dramatic. Referring to FIG. 5, a comparative plot illustrates AM-PM distortion characteristics of the prior art and of a circuit using the present invention. AM-PM distortion occurs because the drive signal and the output signal of the output transistor are nominally 180° out of phase. Hence, even when the leakage signal is quite small compared to the output signal, the phase of the resulting combination may be significantly affect. Observe in FIG. 5 that if the drive signal is a relatively high power drive signal, then at low output magnitudes, the phase of the output signal follows a hook-shaped curve. If the drive signal is a relatively low power drive signal, facilitated by variable bias control as described herein, then at low output magnitudes, the phase of the output signal follows a very nearly linear path.

Figure 6:
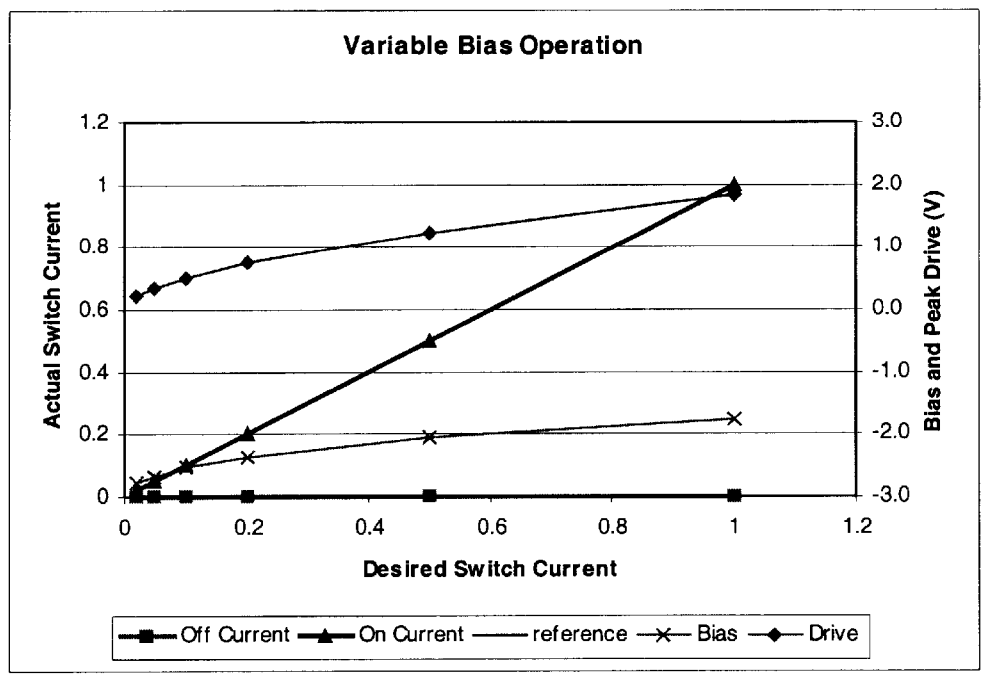
FIG. 6 is a plot of relevant signals within the final amplifier stage under a variable bias condition.

Referring to FIG. 6, an example is shown of variable-bias amplifier stage operation. In this example, the bias voltage ranges from slightly more than −3V to −2V as the drive signal ranges from near zero to slightly less than 2V. Note that, as a result of this variable-bias operation, the actual and desired currents, for both the ON and OFF states, show a remarkable correspondence.

Figure 7:
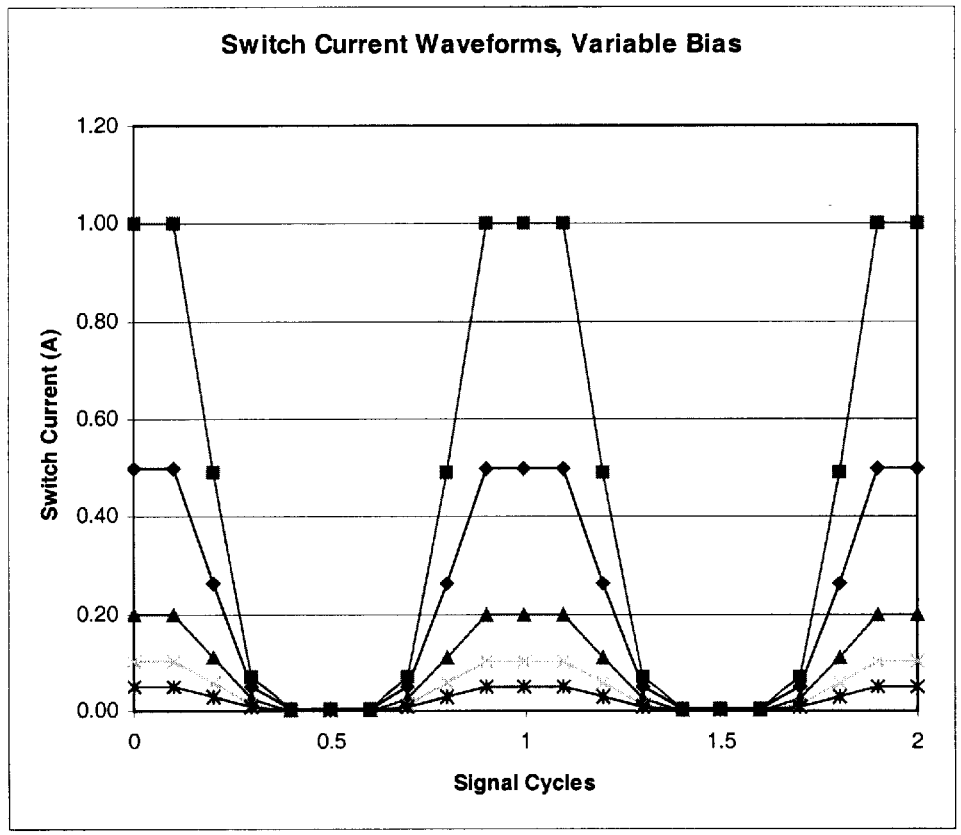
FIG. 7 is a plot of current within the final amplifier stage at various drive levels under a variable bias condition.

The effect of this correspondence on output signal dynamic range is seen in FIG. 7. As the drive level is reduced from full scale to a low level, the current peaks, although they become more gradual and less abrupt, remain distinct. The peak output current at each drive level corresponds very closely with a desired peak output current. Hence, the dynamic range of the switch-mode amplifier stage using variable bias is substantially increased.

In an exemplary embodiment, in order to provide sufficient overdrive into ON and OFF switch states, the bias and drive conditions are controlled in accordance with the following equations:

$$V_{bias} = \frac{1}{2}\sqrt{\frac{I_{sw}}{0.7K}} + \left(\frac{I_{sw}}{10} + 1\right)V_{th}$$

$$V_{drive,pk} = \frac{1}{2}\sqrt{\frac{I_{sw}}{0.7K}} + \left(\frac{V_{th}}{10} + 0.6\right)I_{sw}$$

where K =0.15, $V_{th}$=−3.0V, and $I_{sw}$ is the desired ON switch current. The desired ON switch current is in turn a function of the desired instantaneous output power.

Note the general form of these relationships are characteristic of a FET device, where both the variable bias and peak drive voltages are the sum of a linear and square-root term of the required switch ON current.

Thus, there has been described method and apparatus providing for the effective use of dynamic bias control in a switch-mode RF amplifier to achieve an output signal having wide dynamic range. By dynamically controlling the bias voltage of at least a final amplification stage of an amplifier, the actual peak switch current and the desired peak switch current may be made to closely coincide, even at low signal levels, while assuring that the amplifier transistor still operates as a switch. The resulting high degree of control avoids the need for feedback control of the output signal even for complex signal constellations such as EDGE that exhibit a wide dynamic range.

Although the illustrated embodiment uses dynamic voltage bias control for FET amplification stages, the invention is equally applicable to, e.g., dynamic current bias control for bipolar amplification stages.

It will be apparent to those of ordinary skill in the art that the present invention can be embodied in other specific forms without departing from the spirit or essential character thereof. The described embodiments are therefore intended to be in all respects illustrative and not restrictive. The scope of the invention is indicated by the appended claims, rather than the foregoing description, and all changes which come within the meaning and range of equivalents thereof are intended to be embraced therein.

What is claimed is:

1. A method of amplifying an RF signal to produce a variable output signal using an amplifier including a final amplification stage having a control terminal, the method comprising the steps of:

applying to the control terminal of the final amplification stage a drive signal and a bias signal, wherein the drive signal and the bias signal together cause the final amplification stage to be driven repeatedly between two states, a hard-on state and a hard-off state, without operating in a linear operating region for an appreciable percentage of time, the final amplification stage being controlled without continuous or frequent measurement and feedback adjustment of said variable output signal; and varying the bias signal and the drive signal as a function of a desired output power;

wherein the final amplification stage receives a supply voltage, further comprising varying the supply voltage to control amplitude of the variable output signal.

2. The method of claim 1, wherein the bias signal and the drive signal are decreased as said desired output power decreases.

3. An amplifier having a variable output signal, comprising:

a final amplification stage having a control terminal;

a driver stage preceding the final amplification stage, the driver stage producing a drive signal applied to the control terminal of the final amplification stage; and control circuit producing a variable bias signal, also applied to the control terminal of the final amplification stage, the control circuitry varying the bias signal as a function of a desired output power of the variable output signal;

wherein the drive signal and the bias signal together cause the final amplification stage to be driven repeatedly between two states, a hard-on state and a hard-off state, without operating in a linear operating region for an appreciable percentage of time, the final amplification stage being controlled without continuous or frequent measurement and feedback adjustment of said variable output signal; and wherein the final amplification stage receives a supply voltage, further comprising circuitry for varying the supply voltage to control amplitude of the variable output signal.

4. The apparatus of claim 3, wherein the control circuitry decreases said bias signal as said desired output power decreases.

5. The apparatus of claim 3, wherein the driver stage has a control terminal to which a fixed bias signal is applied.

6. The apparatus of claim 5, wherein the drive stage receives a driver supply voltage, further comprising driver control circuitry for varying the driver supply voltage to control amplitude of the drive signal.

* * * * *